United States Patent
Lee (10) Patent No.: US 9,917,585 B2
(45) Date of Patent: Mar. 13, 2018

(54) DATA OUTPUT CIRCUIT AND METHOD FOR DRIVING THE SAME

(71) Applicant: SK hynix Inc., Gyeonggi-do (KR)

(72) Inventor: Dong-Uk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 958 days.

(21) Appl. No.: 13/935,931

(22) Filed: Jul. 5, 2013

(65) Prior Publication Data

US 2014/0306734 A1 Oct. 16, 2014

(30) Foreign Application Priority Data

Apr. 11, 2013 (KR) ........................ 10-2013-0040057

(51) Int. Cl.
*H03K 19/0175* (2006.01)

(52) U.S. Cl.
CPC ............................ *H03K 19/017509* (2013.01)

(58) Field of Classification Search
CPC ............. H03K 3/356008; H03K 3/012; H03K 19/018521; H03K 2005/00071; H03K 19/00361; H03K 19/01714; H03K 19/17744; H03K 17/063; H03K 2005/00195; H03K 19/0175; H03K 19/017509; H03K 19/0185; H03K 3/53
USPC ...................... 326/58, 62–68, 80–83, 86–87; 327/108–109, 112
See application file for complete search history.

(56) References Cited

U.S. PATENT DOCUMENTS

| | | | | |
|---|---|---|---|---|
| 5,565,796 A * | 10/1996 | Nakase | ............... | G06F 13/4077 326/30 |
| 6,307,417 B1 * | 10/2001 | Proebsting | ......... | H03K 19/0019 327/270 |
| 6,404,237 B1 * | 6/2002 | Mathew | ............. | H03K 19/0963 326/95 |
| 6,707,324 B1 * | 3/2004 | Chu | ................. | H03K 17/04123 326/27 |
| 6,717,440 B2 * | 4/2004 | Morgan | ................ | H04L 25/242 326/21 |
| 7,130,225 B1 * | 10/2006 | Terrovitis | ............... | G11C 5/145 327/157 |
| 7,420,395 B2 * | 9/2008 | Kuramasu | ...... | H03K 19/018528 326/68 |
| 7,728,619 B1 * | 6/2010 | Tzou et al. | ...................... | 326/30 |
| 8,310,855 B2 * | 11/2012 | Riho | ........................ | G11C 5/02 257/686 |
| 8,559,258 B1 * | 10/2013 | Stephens, Jr. | ..... | G11C 11/40615 365/211 |
| 8,611,437 B2 * | 12/2013 | Poulton | .................... | H04B 1/04 375/257 |
| 8,766,678 B2 * | 7/2014 | Jin | ......................... | H03K 17/22 327/143 |
| 9,170,287 B2 * | 10/2015 | Meng-fan | ............. | G01R 25/00 |

(Continued)

FOREIGN PATENT DOCUMENTS

KR 1020010060834 7/2001
KR 1020110138099 12/2011

*Primary Examiner* — Jason M Crawford
(74) *Attorney, Agent, or Firm* — IP & T Group LLP (57) ABSTRACT

A data output circuit includes a data driving unit suitable for driving a data transmission line with a driving voltage corresponding to data during a data transmission operation, and a charging/discharging unit suitable for storing charges on the data transmission line and reuse the stored charges as the driving voltage.

14 Claims, 9 Drawing Sheets

(56) References Cited

U.S. PATENT DOCUMENTS

| | | | |
|---|---|---|---|
| 9,263,371 B2* | 2/2016 | Park | H01L 23/481 |
| 9,275,984 B2* | 3/2016 | Jeong | H01L 27/0203 |
| 2002/0084803 A1* | 7/2002 | Mathew et al. | 326/113 |
| 2002/0089382 A1* | 7/2002 | Yang | H03L 7/0895 |
| | | | 331/17 |
| 2002/0175749 A1* | 11/2002 | Hedberg et al. | 330/9 |
| 2004/0119520 A1* | 6/2004 | Bae | 327/276 |
| 2007/0024328 A1* | 2/2007 | Shin | H03K 17/166 |
| | | | 327/112 |
| 2008/0136487 A1* | 6/2008 | Chen et al. | 327/333 |
| 2010/0052728 A1* | 3/2010 | Lu | H03K 19/00361 |
| | | | 326/27 |
| 2011/0025380 A1* | 2/2011 | Kim | H03K 3/356113 |
| | | | 327/108 |
| 2011/0272788 A1* | 11/2011 | Kim | H01L 25/0657 |
| | | | 257/618 |

* cited by examiner

DATA OUTPUT CIRCUIT AND METHOD FOR DRIVING THE SAME

CROSS-REFERENCE TO RELATED APPLICATIONS

The present application claims priority of Korean Patent Application No. 10-2013-0040057, filed on Apr. 11, 2013, which is incorporated herein by reference in its entirety.

BACKGROUND

1. Field

Exemplary embodiments of the present invention relate to a semiconductor device, and more particularly, to a data output circuit and a method for driving the same.

2. Description of the Related Art

Generally, a semiconductor device including a double data rate synchronous dynamic random access memory (DDR SDRAM) receives a command, an address and data from an external controller and performs a read operation and a write operation. Thus, circuits for inputting and outputting a command, an address, and data, may be disposed in both of the external controller and the semiconductor device.

Figure 1:
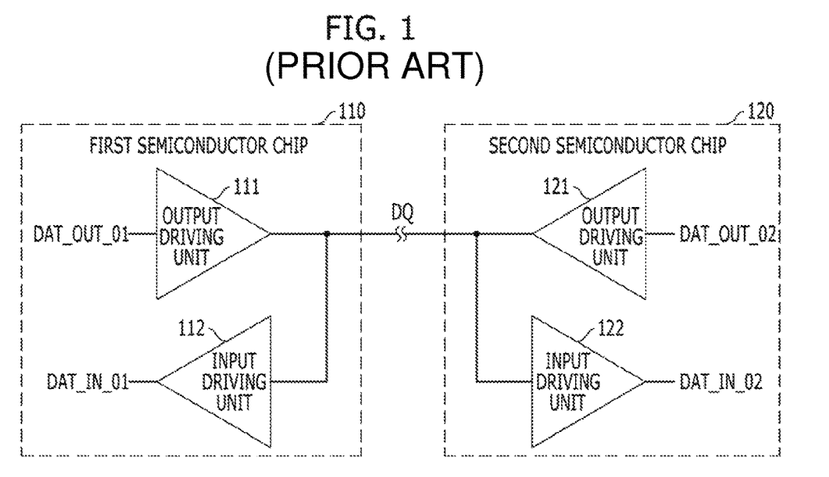
FIG. 1 is a block diagram illustrating a conventional data exchange system.

FIG. 1 is a block diagram illustrating a conventional data exchange system.

Referring to FIG. 1, a conventional data exchange system includes a first semiconductor device 110 and a second semiconductor device 120. The first semiconductor device 110 includes a first output driving unit 111 and a first input driving unit 112. The second semiconductor device 120 includes a second output driving unit 121 and a second input driving unit 122.

An output data DAT_OUT_01 of the first semiconductor device 110 is inputted to the first output driving unit 111. The first output driving unit 111 transfers the output data DAT_OUT_01 to the second semiconductor device 120 through a data transmission line DQ. The second input driving unit 122 of the second semiconductor device 120 receives the output data DAT_OUT_01 of the first semiconductor device 110 through the data transmission line DQ, and outputs an input data DAT_IN_02 of the second semiconductor device 120, which is used in various performances of the second semiconductor device 120.

An output data DAT_OUT_02 of the second semiconductor device 120 is inputted to the second output driving unit 121. The second output driving unit 121 transfers the output data DAT_OUT_02 to the first semiconductor device 110 through the data transmission line DQ. The first input driving unit 112 of the first semiconductor device 110 receives the output data DAT_OUT_02 of the second semiconductor device 120 through the data transmission line DQ, and outputs an input data DAT_IN_01 of the first semiconductor device 110, which is used in various performances of the second semiconductor device 110.

Meanwhile, recently, a semiconductor device has been developed to operate at a high speed and with a low power. Here, it is widely used to increase a number of data lines or raise an operation frequency to implement a high speed operation of the semiconductor device.

However, it may be difficult to unlimitedly increase the number of data lines or raise the operation frequency since the power consumption is increased.

Various methods for the high speed operation and a low power consumption of a semiconductor device may be desirable to be developed.

SUMMARY

Exemplary embodiments of the present invention are directed to a data output circuit and a method for driving the same to reuse an energy used for transferring data in a data transmission operation.

Moreover, embodiments of the present invention are directed to a multi-chip package including a data output circuit for reusing an energy used for transferring data in a data transmission operation.

In accordance with an exemplary embodiment of the present invention, a data output circuit includes a data driving unit suitable for driving a data transmission line with a driving voltage corresponding to data during a data transmission operation, and a charging/discharging unit suitable for storing charges on the data transmission line and reuse the stored charges as the driving voltage.

In accordance with another exemplary embodiment of the present invention, a method for driving an output data circuit includes driving a data transmission line with a driving voltage corresponding to data to be outputted to transmit the data, performing a charging operation using charges on the data transmission line to generate a recovery power driving voltage, after the driving of the data transmission line, and driving the data transmission line with at least the recovery power driving voltage to transmit the data.

In accordance with yet another exemplary embodiment of the present invention, a data output circuit includes a plurality of data driving units suitable for receiving a plurality of driving voltages, and driving each of a plurality of data transmission lines with a driving voltage corresponding to data among the plurality of driving voltages during a data transmission operation, and a common charging unit suitable for being shared by the plurality of data transmission lines, storing charges on the plurality of data transmission lines as a recovery power driving voltage, and providing the recovery power driving voltage as one of the plurality of driving voltages.

In accordance with still another exemplary embodiment of the present invention, a multi-chip package includes a plurality of slave chips suitable for outputting data having a multi-level through a plurality of data transmission through-chip-vias, a master chip suitable for controlling the plurality of slave chips, a common charging unit suitable for storing charges on the plurality of data transmission through-chip-vias, and a first power through-chip-via commonly coupled to the plurality of slave chips, and suitable for receiving and transferring the stored charges of the common charging unit.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
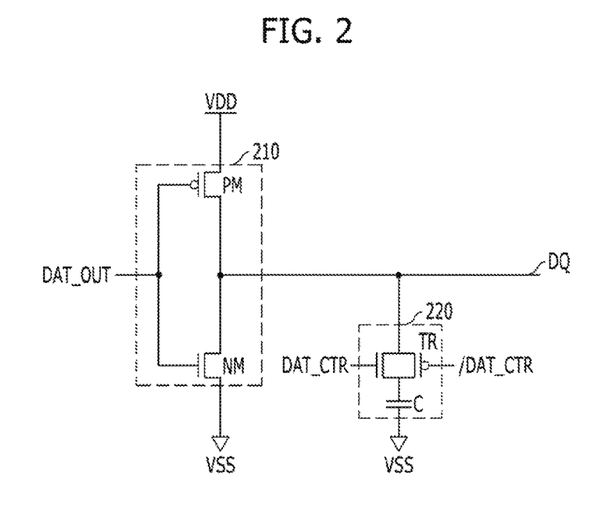
FIG. 2 is a circuit diagram illustrating a data output circuit in accordance with an embodiment of the present invention.

FIG. 2 is a circuit diagram illustrating a data output circuit in accordance with an embodiment of the present invention.

As shown in FIG. 2, a data output circuit in accordance with an embodiment of the present invention includes a data driving unit 210 and a charging/discharging unit 220.

The data driving unit 210 drives a data transmission line DQ based on data DAT_OUT to be outputted during a data transmission operation, and includes a pull-up driving unit PM and a pull-down driving unit NM. The pull-up driving unit PM performs a pull-up driving operation on the data transmission line DQ based on the data DAT_OUT. The pull-down driving unit NM performs a pull-down driving operation on the data transmission line DQ based on the data DAT_OUT. Herein, the pull-up driving operation represents that the data transmission line DQ is driven to a power supply voltage VDD, for example, a logic high level, and the pull-down driving operation represents that the data transmission line DQ is driven to a ground voltage VSS, for example, a logic low level. The pull-up operation and the pull-down operation are referred to as 'data transmission operations'.

The charging/discharging unit 220 includes a capacitor C and a switch TR. The capacitor C is charged by charges remained on the data transmission line DQ. The switch TR exchanges or shares charges between the data transmission line DQ and the capacitor C in response to charging/discharging control signals DAT_CTR and /DAT_CTR. Herein, the charging/discharging control signals DAT_CTR and /DAT_CTR are signals including data information transferred to the data transmission line DQ. That is, the charging/discharging signals DAT_CTR and /DAT_CTR vary based on data information to be transferred. The charging/discharging control signal /DAT_CTR is a complementary signal, for example, an inverted signal, of the charging/discharging control signal DAT_CTR.

Hereinafter, an operation of the data output circuit will be described.

If the data DAT_OUT is a logic low level, the pull-up driving unit PM, for example, a PMOS transistor, of the data driving unit 210 is turned on, and the data transmission line DQ is driven to the power supply voltage VDD. That is, charges are provided to the data transmission line DQ. After the pull-up operation on the data transmission line DQ is performed, if the charging/discharging control signals DAT_CTR and /DAT_CTR are activated, the switch TR for example, a transmission gate, of the charging/discharging unit 220 is turned on. The charges remained on the data transmission line DQ is transferred to the capacitor C through the switch TR. Thus, the transferred charges are stored on the capacitor C.

The charging/discharging unit 220 of the data output circuit in accordance with an embodiment of the present invention stores the charges, which are remained on the data transmission line DQ after the data transmission operation. That is, the charges stored on the charging/discharging unit 220 may be reused in other operations.

Hereinafter, an example of the data transmission operation with reusing the charges will be described. Herein, it is assumed that charges corresponding to a power supply voltage VDD are stored on the capacitor C.

If the data DAT_OUT is a logic high level, the pull-down driving unit NM, for example, a PMOS transistor, is turned on. Thus, the data transmission line DQ is driven to the ground voltage VSS, and the charging/discharging control signals DAT_CTR and /DAT_CTR become an inactivation state based on the output data DAT_OUT. That is, the capacitor C maintains the charged state when the data DAT_OUT is in a logic high level.

If the data DAT_OUT is a logic low level, the charging/discharging control signals DAT_CTR and /DAT_CTR are activated based on the output data DAT_OUT. Thus, the charges stored on the capacitor C are discharged to the data transmission line DQ. That is, the charges stored on the capacitor C are provided to the data transmission line DQ. The data transmission line DQ is pulled-up with the charges provided from the capacitor C. This operation is an exemplary reusing operation of the data output circuit of the present invention.

For reference, if the data DAT_OUT is a logic low level, the pull-up driving unit PM of the data driving unit 210 is turned on during a reusing operation period after an initial driving operation period. However, when it is assumed that the capacitor C has a high capacitance enough to drive the data transmission line DQ, even if the pull-up driving unit PM is not activated during the reusing operation period, it may be possible to drive the data transmission line DQ with the reusing of the charges stored on the capacitor C.

Figure 3:
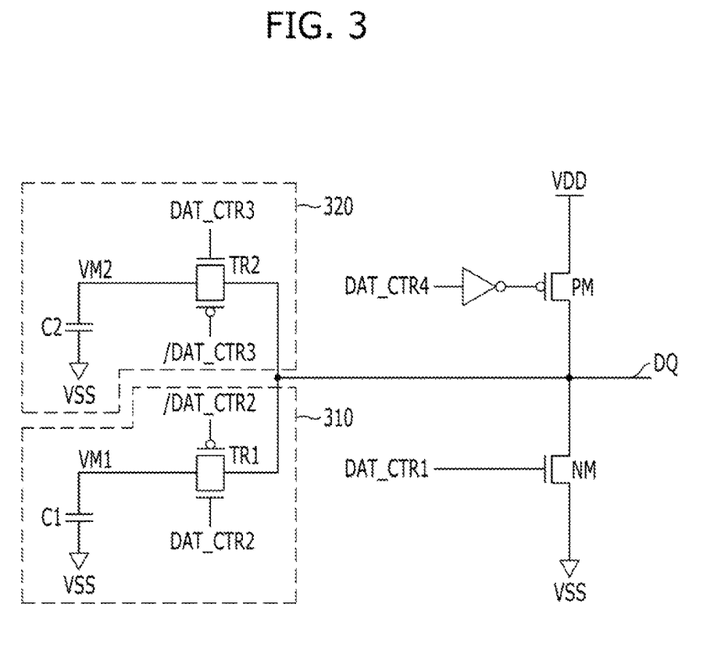
FIG. 3 is a circuit diagram illustrating a data output circuit in accordance with another embodiment of the present invention.

FIG. 3 is a circuit diagram illustrating a data output circuit in accordance with another embodiment of the present invention. FIG. 3 shows a case that the data transmission line DQ is driven by multi driving voltages, for example, four driving voltages, based on the data.

Referring to FIG. 3, the data output circuit includes a pull-down driving unit NM, a first charging/discharging unit 310, a second charging/discharging unit 320, and a pull-up driving unit PM.

The pull-down driving unit NM drives a data transmission line DQ with a ground voltage VSS in response to a first driving control signal DAT_CTR1. The first charging/discharging unit 310 includes a first switch TR1 and a first capacitor C1, and drives the data transmission line DQ with a first recovery power driving voltage VM1 in response to a second driving control signal DAT_CTR2. The second charging/discharging unit 320 includes a second switch TR2 and a second capacitor C2, and drives the data transmission line DQ with a second recovery power driving voltage VM2 in response to a third driving control signal DAT_CTR3. The pull-up driving unit PM drives the data transmission line DQ with a power supply voltage VDD in response to a fourth driving control signal DAT_CTR4. Here, the fourth driving control signal DAT_CTR4 may be inverted to control the pull-up driving unit PM. A complementary second driving control signal /DAT_CTR2 and a complementary third driving control signal /DAT_CTR3 may be used to control the first and second switches TR1 and TR2.

Herein, the first to fourth driving control signals DAT_CTR1, DAT_CTR2, DAT_CTR3 and DAT_CTR4 are controlled based on the data, and control the data transmission line DQ to be driven with a corresponding driving voltage based on the data. The first and second recovery power driving voltages VM1 and VM2 may have a lower voltage level than the power supply voltage VDD and may have a higher voltage level than the ground voltage VSS. The first recovery power driving voltage VM1 may have a lower voltage level than the second recovery power driving voltage VM2. That is, the data transmission line DQ may be driven to the ground voltage VSS, the first recovery power driving voltage VM1, the second recovery power driving voltage VM2 or the power driving voltage VDD in response to the first to fourth driving control signals DAT_CTR1, DAT_CTR2, DAT_CTR3 and DAT_CTR4.

Hereinafter, an operation of the data output circuit will be described.

Figure 9A:
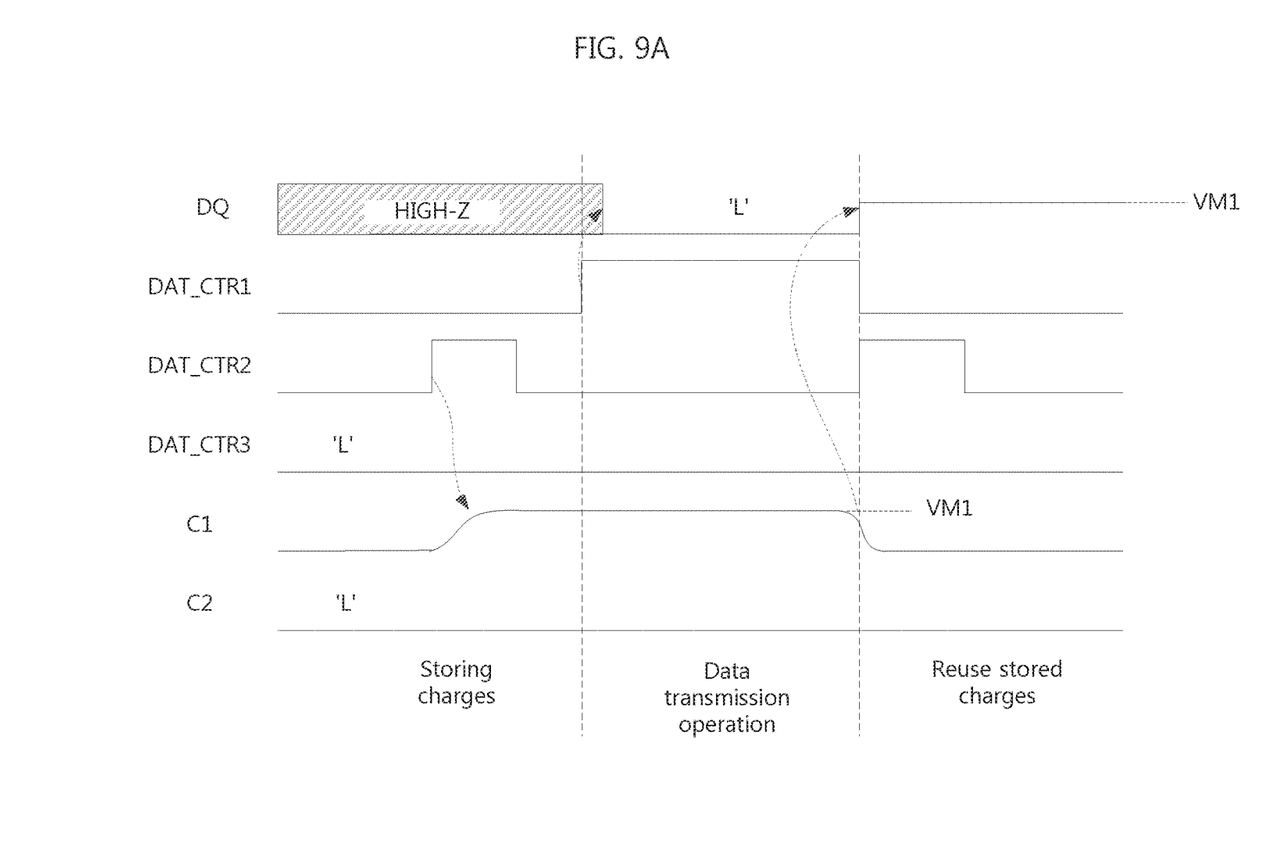
FIGS. 9A and 9B are timing diagrams explaining an operation of the data output circuit shown in FIG. 3.
Figure 9B:
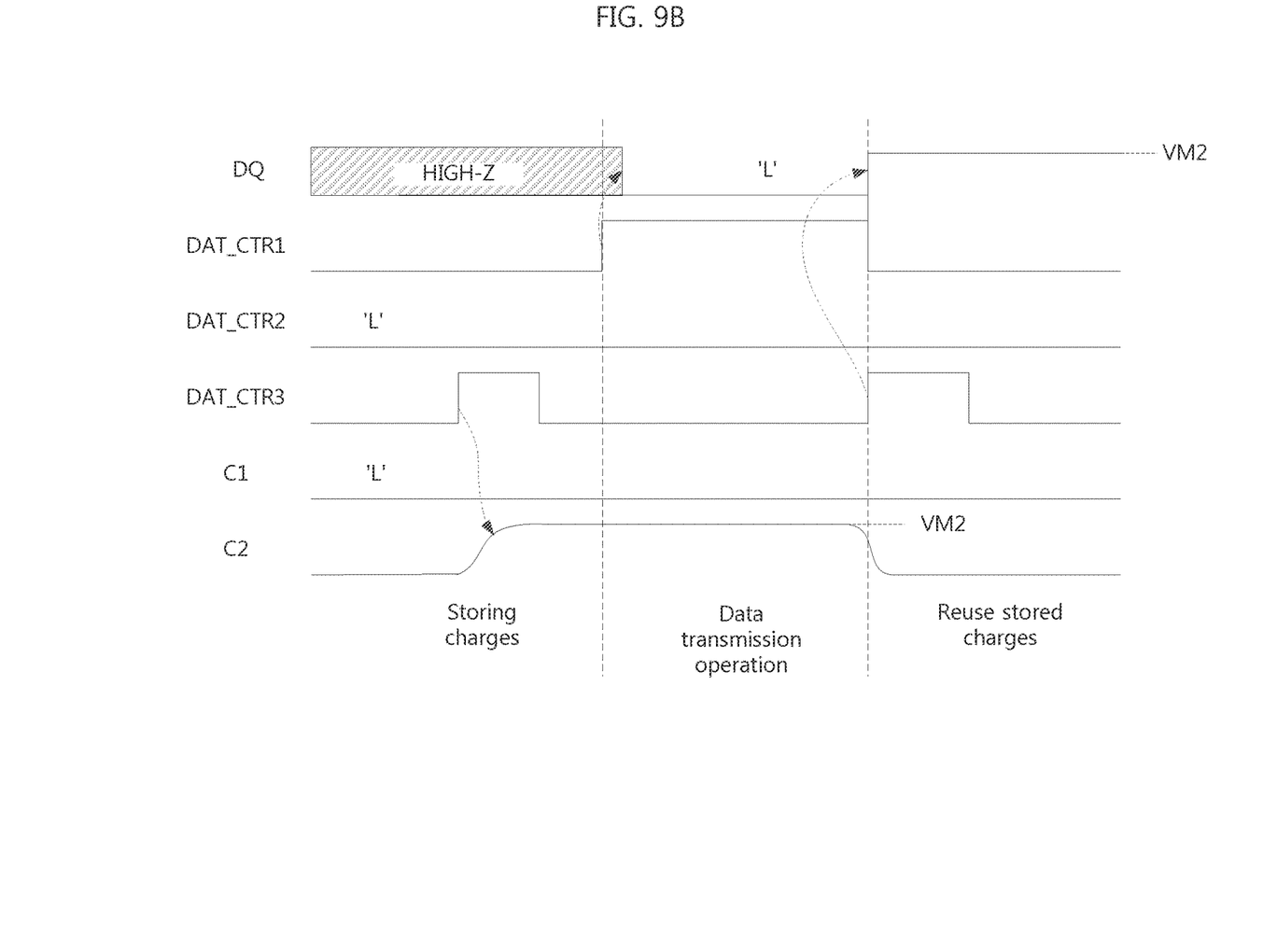

FIGS. 9A and 9B are timing diagrams explaining an operation of the data output circuit shown in FIG. 3. For the convenience of the descriptions, it is assumed that the data transmission line DQ has been driven with the power supply voltage VDD.

FIG. 9A shows that, in case that the data transmission line DQ is driven to the ground voltage VSS, the second driving control signal DAT_CTR2 is activated, and charges remained on the data transmission line DQ are charged before the first driving control signal DAT_CTR1 is activated. FIG. 9B shows that, in case that the data transmission line DQ is driven to the ground voltage VSS, the third driving control signal DAT_CTR3 is activated, and charges remained on the data transmission line DQ are charged before the first driving control signal DAT_CTR1 is activated.

Referring to FIG. 9A, when the second driving control signal DAT_CTR2 is activated, the first switch TR1 is turned on and the first capacitor C1 is charged (see "Storing charges").

Then, the first driving control signal DAT_CTR1 is activated, and thus the data transmission line DQ is driven to the ground voltage VSS (see "Data transmission operation"). Herein, the data transmission line DQ is separated from the first capacitor C1 and the second capacitor C2 since both the second driving control signal DAT_CTR2 and the third driving control signal DAT_CTR3 are inactivated.

The charges stored on the first capacitor C1 and the second capacitor C2 may be reused when a pull-up driving operation is performed (see "Reuse stored charegs"). When the pull-up driving operation is performed, the data transmission line DQ may be driven with the charges, for example, the first recovery power driving voltage VM1, stored on the first capacitor C1 in response to the second driving control signal DAT_CTR2.

Similarly, referring to FIG. 9B, when the third driving control signal DAT_CTR3 is activated, the second switch TR2 is turned on and the second capacitor C2 is charged (see "Storing charges").

Then, the first driving control signal DAT_CTR1 is activated, and thus the data transmission line DQ is driven to the ground voltage VSS (see "Data transmission operation"). Herein, the data transmission line DQ is separated from the first capacitor C1 and the second capacitor C2 since both the second driving control signal DAT_CTR2 and the third driving control signal DAT_CTR3 are inactivated.

The charges stored on the first capacitor C1 and the second capacitor C2 may be reused when a pull-up driving operation is performed (see "Reuse stored charegs"). When the pull-up driving operation is performed, the data transmission line DQ may be driven with the charges, for example, the second recovery power driving voltage VM2 stored on the second capacitor C2 in response to the third driving control signal DAT_CTR3.

Accordingly, the data output circuit in accordance with the embodiment of the present invention may charge and reuse the charges remained on the transmission line DQ. It may be possible to efficiently control the power consumption in the data transmission operation may be efficiently reduced through a reusing operation of the charges.

For reference, in the embodiment of the present invention, a number of charging/discharging units may be changed by a design choice.

Figure 4:
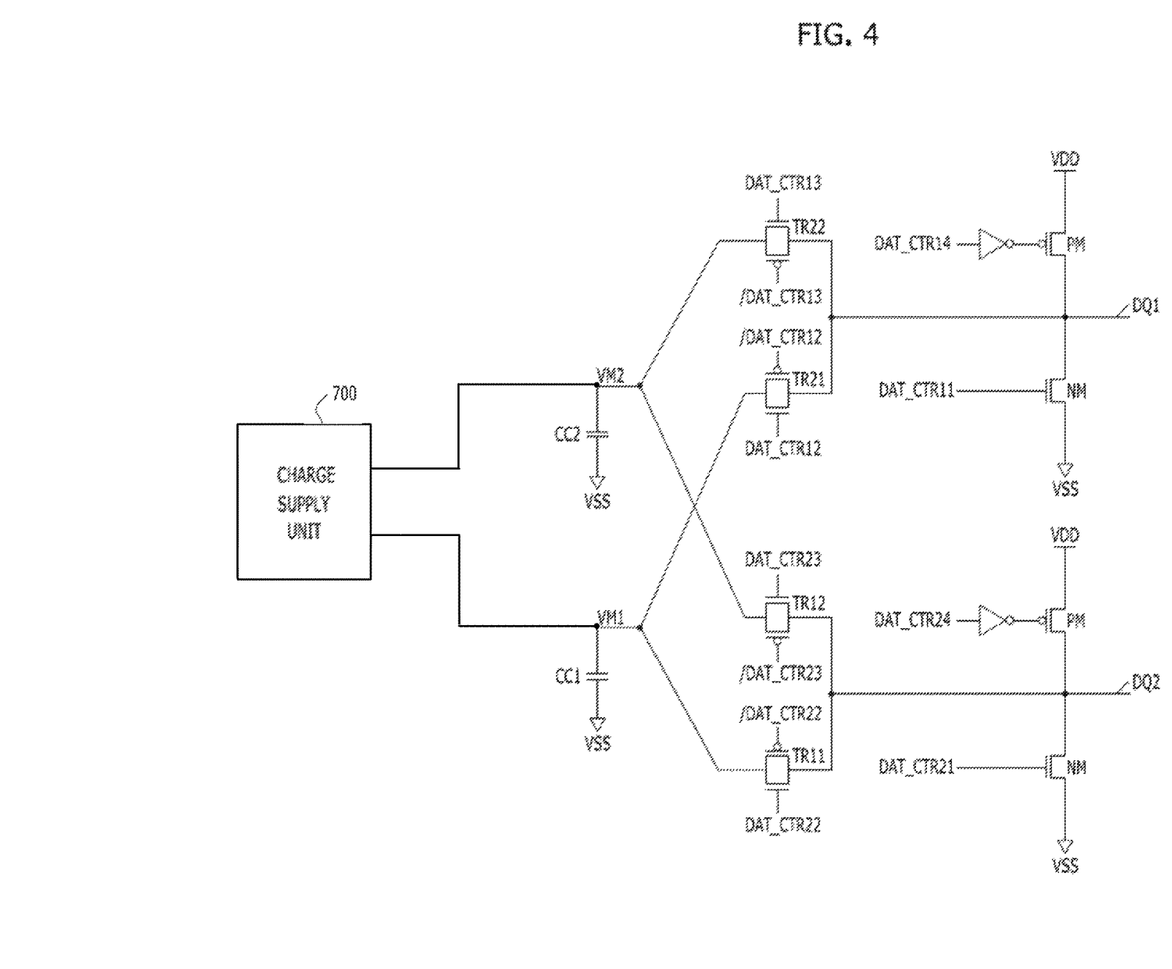
FIG. 4 is a circuit diagram illustrating the data output circuit with a plurality of data transmission lines using the embodiment of the present invention shown in FIG. 3.

FIG. 4 is a circuit diagram illustrating the data output circuit with a plurality of data transmission lines using the embodiment of the present invention shown in FIG. 3. The first and second data transmission lines DQ1 and DQ2 shown in FIG. 4 are driven to four number of driving voltages which are same as those shown in FIG. 3.

Referring to FIG. 4, the data output circuit includes a first data transmission line DQ1, a second data transmission line DQ2, a first capacitor CC1, a second capacitor CC2, a first switch TR11, a second switch TR21, a third switch TR12 and a fourth switch TR22. Each of the first capacitor CC1 and the second capacitor CC2 is shared by the first data transmission line DQ1 and the second data transmission line DQ2. The first capacitor CC1 is coupled to the first switch TR11 and the second switch TR21 to exchange charges with the first data transmission line DQ1 and the second data transmission line DQ2. The second capacitor CC2 is coupled to the third switch TR12 and the fourth switch TR22 to exchange charges with the first data transmission line DQ1 and the second data transmission line DQ2.

Hereinafter, an operation of the data output circuit will be described. For the convenience of the descriptions, it is assumed that the first data transmission line DQ1 and the second data transmission line DQ2 have been driven to the power supply voltage VDD.

First, if a second driving control signal DAT_CTR12 corresponding to the first data transmission line DQ1 and a fourth driving control signal DAT_CTR22 corresponding to the second data transmission line DQ2 are activated during a charging operation, the charges remained on the first data transmission line DQ1 and the second data transmission line DQ2 are charged on the first capacitor CC1. The charges stored on the first capacitor CC1 have a first recovery power driving voltage VM1. If a third driving control signal DAT_CTR13 corresponding to the first data transmission line DQ1 and a fifth driving control signal DAT_CTR23 corresponding to the second data transmission line DQ2 are activated during a charging operation, the charges remained on the first data transmission line DQ1 and the second data transmission line DQ2 are charged on the second capacitor CC2. The charges stored on the second capacitor CC2 have a second recovery power driving voltage VM2.

Next, if the third driving control signal DAT_CTR13 corresponding to the first data transmission line DQ1 is activated during a reusing operation, the second recovery power driving voltage VM2 is discharged to the first data transmission line DQ1. If the second driving control signal DAT_CTR12 corresponding to the first data transmission line DQ1 is activated during the reusing operation, the first recovery power driving voltage VM1 is discharged to the first data transmission line DQ1. If the fifth driving control signal DAT_CTR23 corresponding to the second data transmission line DQ2 is activated during the reusing operation, the second recovery power driving voltage VM2 is discharged to the second data transmission line DQ2. If the fourth driving control signal DAT_CTR22 corresponding to the second data transmission line DQ2 is activated during the reusing operation, the first recovery power driving voltage VM1 is discharged to the second data transmission line DQ1.

That is, the charges stored on each of the first capacitor CC1 and the second capacitor CC2 may be reused during a data transmission operation of the first data transmission line DQ1 and the second data transmission line DQ2.

The data output circuit in accordance with an embodiment of the present invention may include one capacitor shared by a plurality of data transmission lines, and charges remained on the plurality of data transmission lines may be charged and reused.

Figure 5:
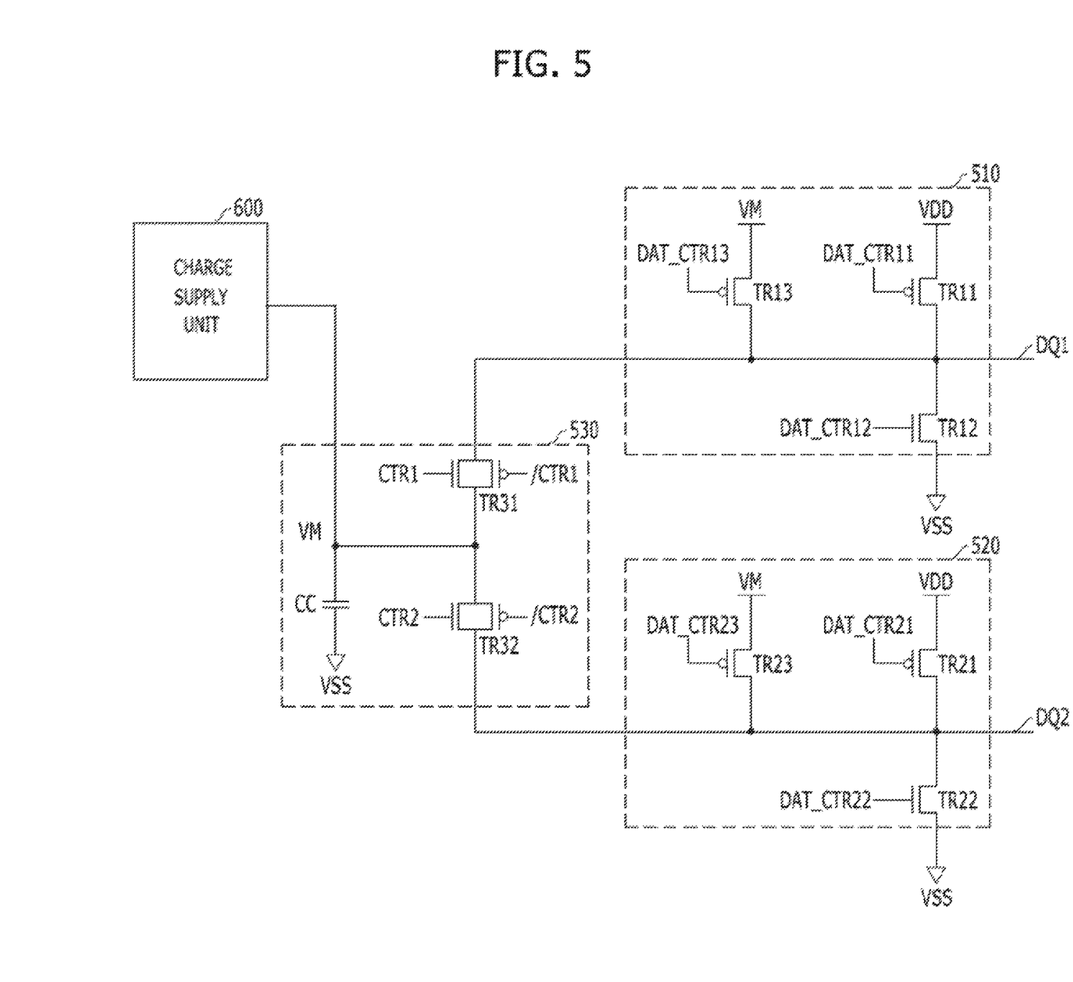
FIG. 5 is a circuit diagram illustrating a data output circuit in accordance with another embodiment of the present invention.

FIG. 5 is a circuit diagram illustrating a data output circuit in accordance with another embodiment of the present invention. A first data transmission line DQ1 and a second data transmission line DQ2 are driven to three driving voltages.

Referring to FIG. 5, the data output circuit includes a first data driving unit 510, a second data driving unit 520 and a common charging unit 530.

The first data driving unit 510 includes a first driving unit TR11, a second driving unit TR12 and a third driving unit TR13, which are coupled to the first data transmission line DQ1, to drive the first data transmission line DQ1 with multi driving voltages. The first driving unit TR11 receives a power supply voltage VDD, and drives the first data transmission line DQ1 with the power supply voltage VDD in response to a first driving control signal DAT_CTR11. The second driving unit TR12 receives a ground voltage VSS, and drives the first data transmission line DQ1 with the ground voltage VSS in response to a second driving control signal DAT_CTR12. The third driving unit TR13 receives a recovery power driving voltage VM, and drives the first data transmission line DQ1 with the recovery power driving voltage VM in response to a third driving control signal DAT_CTR13.

The second data driving unit 520 includes a fourth driving unit TR21, a fifth driving unit TR22 and a sixth driving unit TR23, which are coupled to the second data transmission line DQ2, to drive the second data transmission line DQ1 with multi driving voltages. The fourth driving unit TR21 receives a power supply voltage VDD, and drives the second data transmission line DQ2 with the power supply voltage VDD in response to a fourth driving control signal DAT_CTR21. The fifth driving unit TR22 receives a ground voltage VSS, and drives the second data transmission line DQ2 with the ground voltage VSS in response to a fifth driving control signal DAT_CTR22. The sixth driving unit TR23 receives a recovery power driving voltage VM, and drives the second data transmission line DQ2 with the recovery power driving voltage VM in response to a sixth driving control signal DAT_CTR23.

The common charging unit 530 stores charges remained on the first data transmission line DQ1 and the second data transmission line DQ2, and generates the recovery power driving voltage VM. The common charging unit 530 includes a first switch TR31, a second switch TR32 and a common capacitor CC. The first switch TR31 and the second switch TR32 performs a switching operation in response to a first charging control signal CTR1 and a second charging control signal CTR2, which are activated during a charging period for charging the charges remained on the first data transmission line DQ1 and the second data transmission line DQ2.

The common charging unit 530 shares the first data transmission line DQ1 and the second data transmission line DQ2, and provides the recovery power driving voltage VM to the third driving unit TR13 and the sixth driving unit TR23 corresponding to the first data transmission line DQ1 and the second data transmission line DQ2, respectively.

Hereinafter, an operation of the data output circuit will be described. For the convenience of the descriptions, it is assumed that the first data transmission line DQ1 and the second data transmission line DQ2 have been driven to the power supply voltage VDD.

First, the charges remained on the first data transmission line DQ1 and the second data transmission line DQ2 are charged on the common capacitor CC in response to the first charging control signal CTR1 and the second charging control signal CTR2, respectively, during a charging operation. The common capacitor CC provides the recovery power driving voltage VM to the third driving unit TR13 and the sixth driving unit TR23 corresponding to the first data transmission line DQ1 and the second data transmission line DQ2. For reference, after the charging operation is performed, the first charging control signal CTR1 and the second charging control signal CTR2 are maintained with an inactivation state, and the first switch TR31 and the second switch TR32 are turned off. Subsequently, the recovery power driving voltage VM provided to the third driving unit TR13 and the sixth driving unit TR23 are used in driving of the first data transmission line DQ1 and the second data transmission line DQ2 based on data to be output.

The data output circuit in accordance with an embodiment of the present invention performs a reusing operation by charging the charges remained on a plurality of data transmission lines and providing stored charges as one of the driving voltages to a driving circuit.

Meanwhile, as described above, the data output circuit in accordance with an embodiment of the present invention performs a reusing operation of charge. However, if data corresponding to an recovery power driving voltage VM is output consecutively, stored charges may be discharged and a data transmission operation may be not performed. Thus, a following embodiment of the present invention will be described to solve the above-described concerns.

Figure 6:
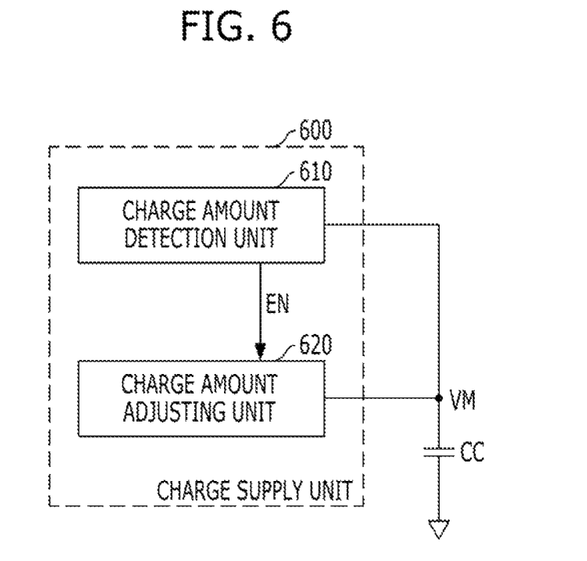
FIG. 6 is a block diagram illustrating a charge supply unit in accordance with another embodiment of the present invention.

FIG. 6 is a block diagram illustrating a charge supply unit in accordance with another embodiment of the present invention. For the convenience of the descriptions, it is assumed that a charge supplying unit 600 is coupled to the common capacitor CC shown in FIG. 5.

Referring to FIG. 6, the charge supplying unit 600 includes a charge amount detection unit 610 and a charge amount adjusting unit 620.

The charge amount detection unit 610 detects an amount of charges stored on the common capacitor CC. An activation state of an enable signal EN is determined based on a charge amount of the common capacitor CC. The charge amount adjusting unit 620 adjusts a charge amount of the common capacitor CC in response to the enable signal EN. If the charge amount of the common capacitor CC is less than a predetermined value, charges may be further charged on the common capacitor CC. If the charge amount of the common capacitor CC is larger than the predetermined value, the charges stored on the common capacitor CC may be discharged. Herein, the charge amount adjusting unit 620 may be implemented with a differential amplifier or a simple configuration using a transistor.

Figure 7:
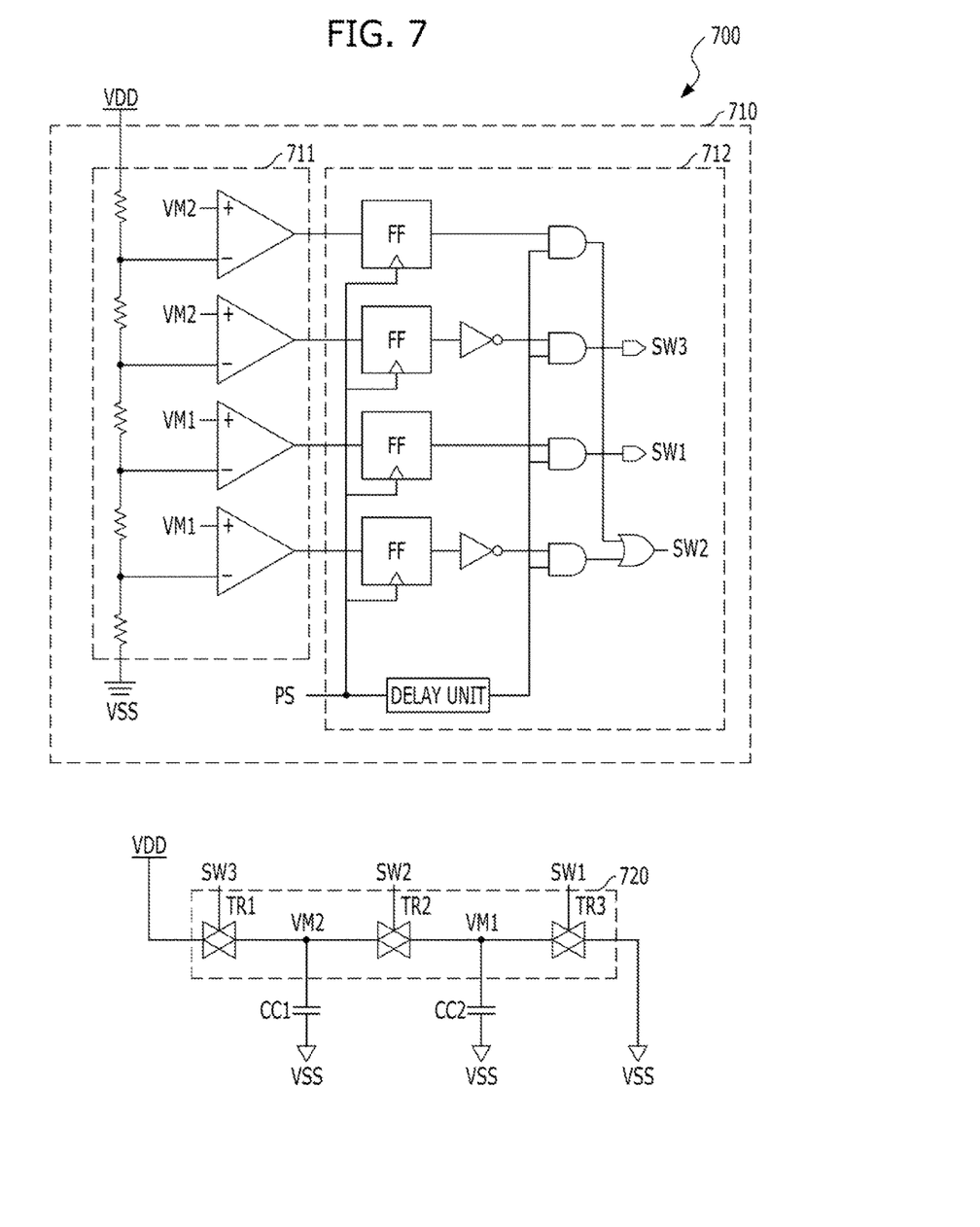
FIG. 7 is a circuit diagram illustrating a charge supply unit in accordance with another embodiment of the present invention.

FIG. 7 is a circuit diagram illustrating a charge supply unit in accordance with another embodiment of the present invention. For the convenience of the descriptions, it is assumed that the charge supply unit is coupled to the first capacitor CC1 and the second capacitor CC2 shown in FIG. 4.

Referring to FIG. 7, a charge supply unit 700 includes a charge amount detection unit 710 and a charge amount adjusting unit 720.

The charge amount detection unit 710 detects a charge amount of the first capacitor CC1 and the second capacitor CC2, and includes a voltage detection unit 711 and a signal generation unit 712.

The voltage detection unit 711 detects a voltage level of a first recovery power driving voltage VM1 and a second recovery power driving voltage VM2. The signal generation unit 712 receives an output signal of the voltage detection unit 711 and outputs first to third control signals SW1, SW2 and SW3 in response to an activated signal PS at a predetermined time.

The charge amount adjusting unit 720 adjusts a charge amount of the first capacitor CC1 and the second capacitor CC2 in response to the first to third control signals SW1, SW2 and SW3, and includes first to third transfer units TR1, TR2 and TR3.

Hereinafter, an operation of the charge supply unit will be described.

In case that the second mediate power driving voltage VM2 is higher than a predetermined voltage level, the second control signal SW2 is activated. Thus, the second transfer unit TR2 is turned on, and the charges of the first capacitor CC1 may be transferred to the second capacitor CC2.

In case that the second mediate power driving voltage VM2 is higher than a predetermined voltage level, the third control signal SW3 is activated. Thus, the third transfer unit TR3 is turned on, charges of the power supply voltage VDD terminal may be transferred to the first capacitor CC1.

A charge transfer operation according to a voltage level of the first recovery power driving voltage VM1 will be omitted since the charge transfer operation is similar to that of the second recovery power driving voltage VM2.

Figure 8:
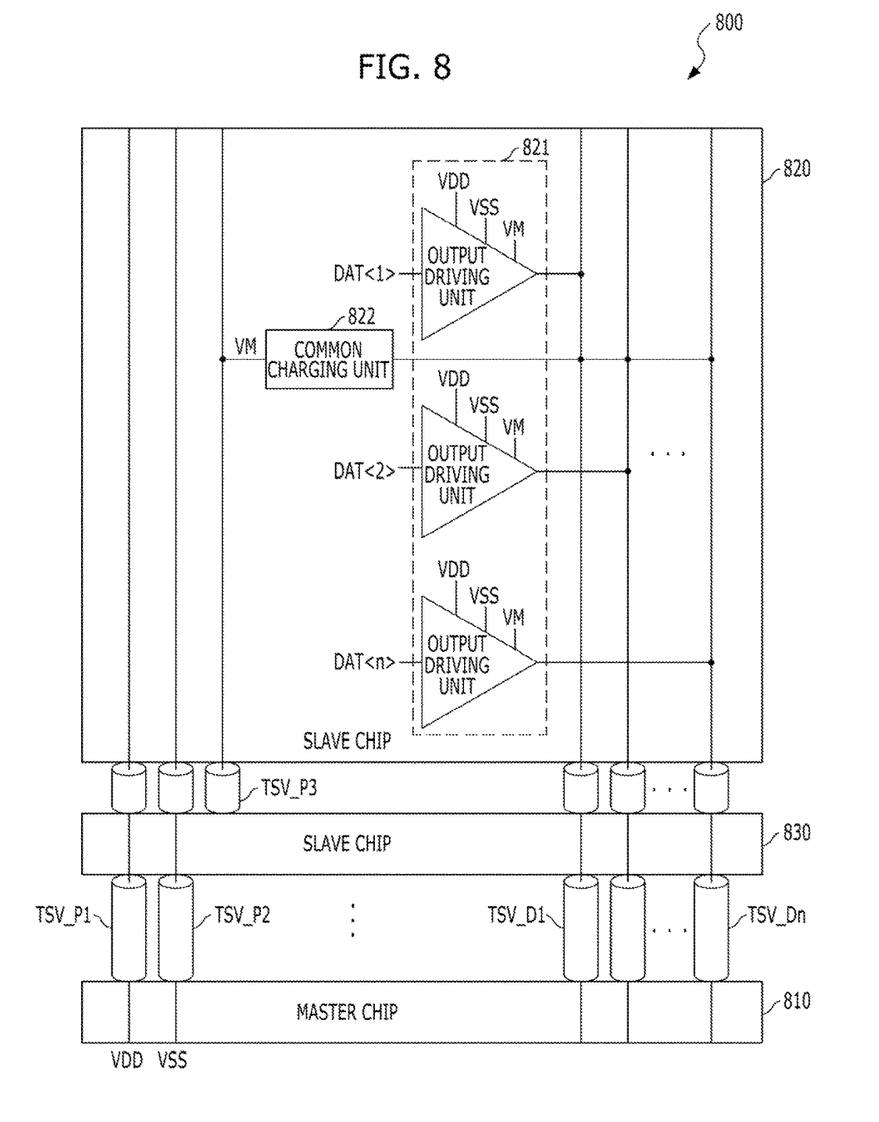
FIG. 8 is a circuit diagram illustrating a multi-chip package in accordance with another embodiment of the present invention.

FIG. 8 is a circuit diagram illustrating a multi-chip package in accordance with another embodiment of the present invention.

Referring to FIG. 8, a multi-chip package 800 includes a master chip 810 and a plurality of slave chips 820 and 830. The master chip 810 is commonly coupled to the plurality of slave chips 820 and 830 through a through-chip-via, for example, a through-silicon-via, (TSV). For the convenience of the descriptions, the TSV for transferring a power and data is shown in FIG. 8. That is, a power TSV TSV_P1 and TSV_P2 for supplying a power supply voltage VDD and a ground voltage VSS, and a data TSV TSV_D1 and TSV_Dn for transferring first to $n_{th}$ data are shown in FIG. 8. A charge TSV TSV_P3 for receiving and transferring a recovery power driving voltage VM.

First, the master chip 810 controls a plurality of slave chips 820. The plurality of slave chips 820 perform various operations based on a control of the master chip 810. For the convenience of the descriptions, one of the plurality of slave chips 820 will be described.

The slave chip 820 includes first to $n_{th}$ output driving units 821, and a common charging unit 822. The first to $n_{th}$ output driving units 821 receive the power supply voltage VDD, the ground voltage VSS and the recovery power driving voltage VM, and drives first to $n_{th}$ data TSVs TSV_D1, . . . , TSV_Dn corresponding to first to $n_{th}$ data DAT<1:n> to be outputted. As shown in FIG. 8, the first to $n_{th}$ output driving units 821 receive the power supply voltage VDD, the ground voltage VSS and the recovery power driving voltage VM. This represents that output data of the first to $n_{th}$ output driving units 821 may have three levels.

The common charging unit 822 is charged by charges remained on the first to $n_{th}$ data TSVs TSV_D1, . . . , TSV_Dn. The stored charges have the recovery power driving voltage VM, and are supplied to the first to $n_{th}$ output driving units 821 through the charge TSV TSV_P3.

The multi-chip package in accordance with an embodiment of the present invention may be charged by the charges remained on a plurality of data TSVs TSV_D1, . . . , TSV_Dn and transfer the stored charges to the plurality of slave chips 820 and 830 through the charge TSV TSV_P3.

Meanwhile, it is an exemplary description that the charge TSV TSV_P3 shown in FIG. 8 is coupled to the plurality of slave chips 820 and 830. However, if the recovery power driving voltage VM is used in the master chip 810, the charge TSV TSV_P3 may be coupled to the master chip 810.

As described above, the charges used in a data transmission operation may be reused in embodiments of the present invention. A power consumption of the data transmission operation may be efficiently controlled by the reusing operation of the charge. As a result, a high speed operation may be implemented without increasing a number of data transmission lines, for example, TSVs, and raising an operation frequency.

The data output circuit in accordance with embodiments of the present invention minimizes a power consumption of data transmission operation by reusing an energy, which is used for transferring data, during a data transmission operation.

While the present invention has been described with respect to the specific embodiments, it will be apparent to those skilled in the art that various changes and modifications may be made without departing from the spirit and scope of the invention as defined in the following claims.

Moreover, a location and a kind of a logic gate and a transistor, which are exemplarily described in embodiments of the present invention, may be differently designed according to a polarity of an input signal.

What is claimed is:

1. A data output circuit, comprising:
a data driving unit suitable for driving a data transmission line with a driving voltage corresponding to data during a data transmission operation;
a charging/discharging unit suitable for storing remained charges on the data transmission line during the data transmission operation and supplying the stored charges as the driving voltage to the data transmission by discharging the stored charges during a reusing operation, and including a capacitor charged by the charges of the data transmission line; and a charge supply unit suitable for supplying additional charges to the capacitor, which is charged by the remained charges of the data transmission line, wherein the charge supply unit comprises:

a detection unit suitable for detecting a charge amount of the capacitor; and an adjusting unit suitable for adjusting a charge amount of the capacitor in response to an output signal of the detection unit.

2. The data output circuit of claim 1, wherein the charging/discharging unit further comprises:

a switch suitable for selectively sharing the charges between the data transmission line and the capacitor.

3. The data output circuit of claim 1, wherein the charging/discharging unit provides the stored charges to the data transmission line based on data to be outputted.

4. The data output circuit of claim 1, further comprising a supplementary charging/discharging unit corresponding to the data transmission line.

5. The data output circuit of claim 1, further comprising at least one additional data transmission line, wherein the charging/discharging unit shares the data transmission line and the additional data transmission line.

6. The data output circuit of claim 5, wherein the charging/discharging unit comprises:

the capacitor suitable for being charged by the charges of the data transmission line and the additional data transmission line; and a plurality of switches suitable for sharing the charges between the respective data transmission lines and the capacitor.

7. A data output circuit, comprising:

a plurality of data driving units suitable for receiving a plurality of driving voltages, and driving each of a plurality of data transmission lines with a driving voltage corresponding to data among the plurality of driving voltages during a data transmission operation;

a common charging unit suitable for being shared by the plurality of data transmission lines, storing remained charges on the plurality of data transmission lines as a recovery power driving voltage during the data transmission operation, and providing the recovery power driving voltage as one of the plurality of driving voltages to the plurality of data transmission lines during a reusing operation, wherein the common charging unit includes a capacitor charged by the remained charges on the plurality of data transmission lines; and a charge supply unit suitable for supplying additional charges to the capacitor, and comprising a detection unit suitable for detecting a charge amount of the capacitor; and an adjusting unit suitable for adjusting a charge amount of the capacitor in response to an output signal of the detection unit, wherein each of the plurality of data driving units comprises a first driver receiving a power supply voltage as a first driving voltage, a second driver receiving a ground voltage as a second driving voltage, and a third driver receiving the recovery power driving voltage as a third driving voltage.

8. The data output circuit of claim 7, wherein the common charging unit further comprises:

a plurality of switches suitable for selectively sharing the charges between the capacitor and the plurality of data transmission lines.

9. A multi-chip package, comprising:

a plurality of slave chips suitable for outputting data having at least three output levels through a plurality of data transmission through-chip-vias;

a master chip suitable for controlling the plurality of slave chips;

a common charging unit suitable for storing charges on the plurality of data transmission through-chip-vias as a recovery power driving voltage, and providing the recovery power driving voltage as one of the output levels; and a first power through-chip-via commonly coupled to the plurality of slave chips, and suitable for receiving and transferring the stored charges of the common charging unit, wherein the common charging unit comprises:

a capacitor suitable for being charged by the charges on the plurality of data transmission through-chip-vias; and a plurality of switches suitable for transferring the charges between the plurality of data transmission through-chip-vias and the capacitor.

10. The multi-chip package of claim 9, wherein the first power through-chip-via is coupled to the master chip.

11. The multi-chip package of claim 9, further comprising:

a second power through-chip-via commonly coupled to the master chip and the plurality of slave chips, and suitable for supplying a power to the master chip and the plurality of slave chips.

12. The multi-chip package of claim 11, wherein the plurality of slave chips receive the power through the second power through-chip-via and the first power through-chip-via, and generate the data having the output levels.

13. The multi-chip package of claim 9, further comprising:

a charge supply unit suitable for supplying additional charges to the capacitor.

14. The multi-chip package of claim 13, wherein the charge supply unit comprises:

a detection unit suitable for detecting a charge amount of the capacitor; and an adjusting unit suitable for adjusting a charge amount of the capacitor in response to an output signal of the detection unit.

\* \* \* \* \*